(12) United States Patent
Zhou et al.

(10) Patent No.: US 11,283,206 B2
(45) Date of Patent: Mar. 22, 2022

(54) IMPEDANCE CONTROLLED METALLIZED PLASTIC SOCKET

(71) Applicant: SMITHS INTERCONNECT AMERICAS, INC., Kansas City, KS (US)

(72) Inventors: Jiachun Zhou, Gilbert, AZ (US); Khaled Elmadbouly, Gilbert, AZ (US); Dexian Liu, Jiangsu (CN); Noah Weichselbaum, Fairway, KS (US)

(73) Assignee: SMITHS INTERCONNECT AMERICAS, INC., Kansas City, KS (US)

( * ) Notice: Subject to any disclaimer, the term of this patent is extended or adjusted under 35 U.S.C. 154(b) by 0 days.

(21) Appl. No.: 16/982,524

(22) PCT Filed: Mar. 20, 2019

(86) PCT No.: PCT/US2019/023219
§ 371 (c)(1),
(2) Date: Sep. 18, 2020

(87) PCT Pub. No.: WO2019/183254
PCT Pub. Date: Sep. 26, 2019

(65) Prior Publication Data
US 2021/0005992 A1 Jan. 7, 2021

Related U.S. Application Data

(60) Provisional application No. 62/647,527, filed on Mar. 23, 2018.

(51) Int. Cl.
*H01R 12/71* (2011.01)
*H01R 13/15* (2006.01)
(Continued)

(52) U.S. Cl.
CPC ............ *H01R 12/716* (2013.01); *H01R 13/15* (2013.01); *H01R 13/6585* (2013.01); *H01R 24/38* (2013.01); *H01R 43/20* (2013.01)

(58) Field of Classification Search
CPC ...... H01R 12/716; H01R 13/15; H01R 13/17; H01R 13/187; H01R 13/6585; H01R 24/38; H01R 24/50; H01R 43/20
See application file for complete search history.

(56) References Cited

U.S. PATENT DOCUMENTS

| | | | | |
|---|---|---|---|---|
| 5,727,954 A | * | 3/1998 | Kato | ................... H01R 13/2421 |
| | | | | 439/66 |
| 8,956,193 B2 | * | 2/2015 | Tran | ................... G01R 1/06722 |
| | | | | 439/700 |

(Continued)

FOREIGN PATENT DOCUMENTS

| | | |
|---|---|---|
| JP | 2017-076587 | 4/2017 |
| KR | 10-2017-0110346 | 10/2017 |
| WO | WO2017/164631 | 9/2017 |

OTHER PUBLICATIONS

International Search Report and Written Opinion of the International Searching Authority (dated Jul. 5, 2019) for Corresponding International PCT Patent Application No. PCT/US2019/023219, filed Mar. 19, 2019.

*Primary Examiner* — Oscar C Jimenez
(74) *Attorney, Agent, or Firm* — Snell & Wilmer LLP

(57) ABSTRACT

Methods, systems, and apparatus for an electrical connector assembly for connecting an integrated circuit chip to a printed circuit board. The electrical connector assembly includes a socket body that is made of an insulating material. The socket body has a top surface, a bottom surface, and a first plurality of cavities including a first cavity and a second cavity. The first cavity and the second cavity each have an inner surface plated with a conductive material to form a (Continued)

metal grounding shell. The electrical connector assembly includes multiple probes including a first probe and a second probe. The first probe is configured to be positioned within the first cavity and the second probe is configured to be positioned within the second cavity. The electrical connector assembly includes one or more signal traces that electrically connect the metal grounding shells of the first cavity and the second cavity.

17 Claims, 7 Drawing Sheets

(51) Int. Cl.
*H01R 13/6585* (2011.01)
*H01R 24/38* (2011.01)
*H01R 43/20* (2006.01)

(56) References Cited

U.S. PATENT DOCUMENTS

| | | | |
|---|---|---|---|
| 9,039,448 B2* | 5/2015 | Mason | H01R 13/658 |
| | | | 439/607.09 |
| 9,276,336 B2* | 3/2016 | Rathburn | H01R 12/52 |
| 9,689,897 B2* | 6/2017 | Rathburn | G01R 1/0466 |
| 9,972,948 B2* | 5/2018 | Wagner | H01R 24/50 |
| 2007/0145991 A1 | 6/2007 | Yoshida | |
| 2010/0087075 A1* | 4/2010 | Kazama | G01R 1/0466 |
| | | | 439/85 |
| 2012/0199985 A1 | 8/2012 | Rathbum | |
| 2012/0315775 A1 | 12/2012 | Bartsch et al. | |
| 2015/0168450 A1 | 6/2015 | Wooden et al. | |
| 2018/0238957 A1 | 8/2018 | Nakamura et al. | |
| 2019/0018045 A1 | 1/2019 | Jeong | |
| 2020/0225265 A1* | 7/2020 | Hironaka | G01R 1/07314 |

* cited by examiner

IMPEDANCE CONTROLLED METALLIZED PLASTIC SOCKET

CROSS-REFERENCE TO RELATED APPLICATIONS

This application claims priority to and the benefit of U.S. Provisional Patent Application No. 62/647,527 titled "IMPEDANCE CONTROLLED METALLIZED PLASTIC SOCKET," filed on Mar. 23, 2018, and the entirety of which is hereby incorporated by reference herein.

BACKGROUND

1. Field

This specification relates to a system, method or apparatus for an impedance controlled test system and a method for manufacturing the same.

2. Description of the Related Art

In the electronics and semiconductor industries, systems used to test integrated circuit chips may be referred to as test systems. To test higher frequency integrated circuit (IC) chips, the test systems should transmit a high frequency signal with smaller signal loss. A test system may include a socket body and socket retainer defining a plurality of cavities. Each cavity may receive a contactor, which may be a spring probe. Conventionally there are two approaches used maintaining signal integrity in test systems—to use relatively short contactors or to use a coaxial structure for the contactors. Short contactors may have the shortcomings of having small compliance and high compression force, which may limit its applications in small size integrated circuit packages. Using a coaxial structure for the contactor may be used when performing high-frequency integrated circuit package testing. Contactors with coaxial structures may be used for testing large sized integrated circuit packages and high count I/O packages while maintaining performance standards. The contactors with the coaxial structure may have an insulated metal structure, but these coaxial structures with the insulated metal structure still do not new requirements from customers of approximately ~56 Gbps.

Accordingly, there is a need for an impedance controlled test socket for testing higher frequency IC chips.

SUMMARY

In general, one aspect of the subject matter described in this specification may be embodied in an electrical connector assembly. The electrical connector assembly connects an integrated circuit chip to a printed circuit board. The electrical connector assembly includes a socket body. The socket body is made of an insulating material. The socket body has a top surface, a bottom surface, and a first multiple of cavities including a first cavity and a second cavity. The first cavity and the second cavity extend from the top surface through to the bottom surface. The first cavity and the second cavity each have an inner surface plated or coated with a conductive material to form a metal grounding shell. The electrical connector assembly includes multiple probes. The multiple probes include a first probe and a second probe. The first probe is configured to be positioned within the first cavity and the second probe is configured to be positioned within a second cavity. The electrical connector assembly includes one or more signal traces that electrically connect the metal grounding shells of the first cavity and the second cavity.

These and other embodiments may optionally include one or more of the following features. The electrical connector assembly may include a socket retainer. The socket retainer may be made of the insulating material. The socket retainer may have a top surface, a bottom surface and a second multiple of cavities including a first cavity and a second cavity. The second multiple of cavities may be aligned with the first multiple of cavities.

The first cavity and the second cavity of the first multiple of cavities may be aligned with the first cavity and the second cavity of the second multiple of cavities. The first probe may be a signal contact probe and the second probe may be a ground contact probe.

The first multiple of cavities may include a third cavity. The third cavity may be a power contact cavity. The power contact cavity may be configured to encapsulate a power contact probe that provides power when inserted. The one or more signal traces may electrically connect the metal grounding shell of the ground spring probe cavity and the metal grounding shell of the signal pin cavity hole to form a coaxial structure. The coaxial structure may provide a controlled impedance to improve signal integrity.

The first multiple of cavities may include one or more ground needle cavities. The one or more ground needle cavities may extend through a length of the socket body. The electrical connector assembly may include one or more ground needles. The one or more ground needles may be configured to filter noise and improve radio frequency performance. The one or more ground needles may be positioned in the one or more ground needle cavities and may be adjacent to or around the signal pin cavity hole.

The first probe may have a first plunger, a second plunger, a first end, a second end and a cylindrical shell in between the first end and the second end. The first plunger may be on the first end and the second plunger may be on the second end. The first probe may be a spring probe. The spring probe may have a spring within the cylindrical shell.

In another aspect, the subject matter is embodied in an electrical connector assembly. The electrical connector assembly connects an integrated circuit chip to a printed circuit board. The electrical connector assembly includes an insulated body. The insulated body has a top surface, a bottom surface, a signal spring pin cavity hole and a ground spring probe cavity. The signal spring pin cavity hole and the ground spring probe cavity each have an interior surface plated with a conductive material to form a metal grounding shell. The electrical connector assembly includes multiple probes. The multiple probes include a signal contact probe and a ground contact probe. The electrical connector assembly includes one or more signal traces that electrically connect the metal grounding shells of the signal spring pin cavity hole and the ground spring probe cavity to form a coaxial structure.

In another aspect, the subject matter is embodied in a method of forming or fabricating an electrical connector assembly. The method includes machining or drawing one or more holes on an insulated body to form a first cavity and a second cavity. The method includes depositing a layer of conductive material on the insulated body. The method includes depositing a thin layer on insulative material on the layer of conductive material on a top surface of the insulated body. The method includes machining or drawing one or more additional holes on the insulated body to form a third cavity. The method includes positioning or assembling one or more probes into the first cavity, the second cavity and the third cavity.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are systems, apparatuses, devices and/or methods for testing higher frequency IC chips. New technologies and products are required to handle testing of high frequency IC chips, as existing technology is unable to handle high frequencies (e.g., >56 Gbps or >70 GHz). The electrical connector assembly connects an integrated circuit chip to a printed circuit board. The electrical connector assembly described herein uses metallized plastic composite materials with a coaxial structure for the test socket.

Particular embodiments of the subject matter described in this specification may be implemented to realize one or more of the following advantages. The connector assembly has metallized plastic composite material with a coaxial structure. The metallized plastic composite material increases performance and reduces signal loss for higher frequency IC chips, such as greater than 56 Gbps or greater than 70 GHz.

Other benefits and advantages include having a flexible design. The flexible design allows the connector assembly to be used for various different applications. For example, the connector assembly described herein may also be used with small pitches (e.g., <0.65 mm). Different configurations of the one or more cavities and probes allow for the testing of different integrated circuit (IC) chips.

Figure 1:
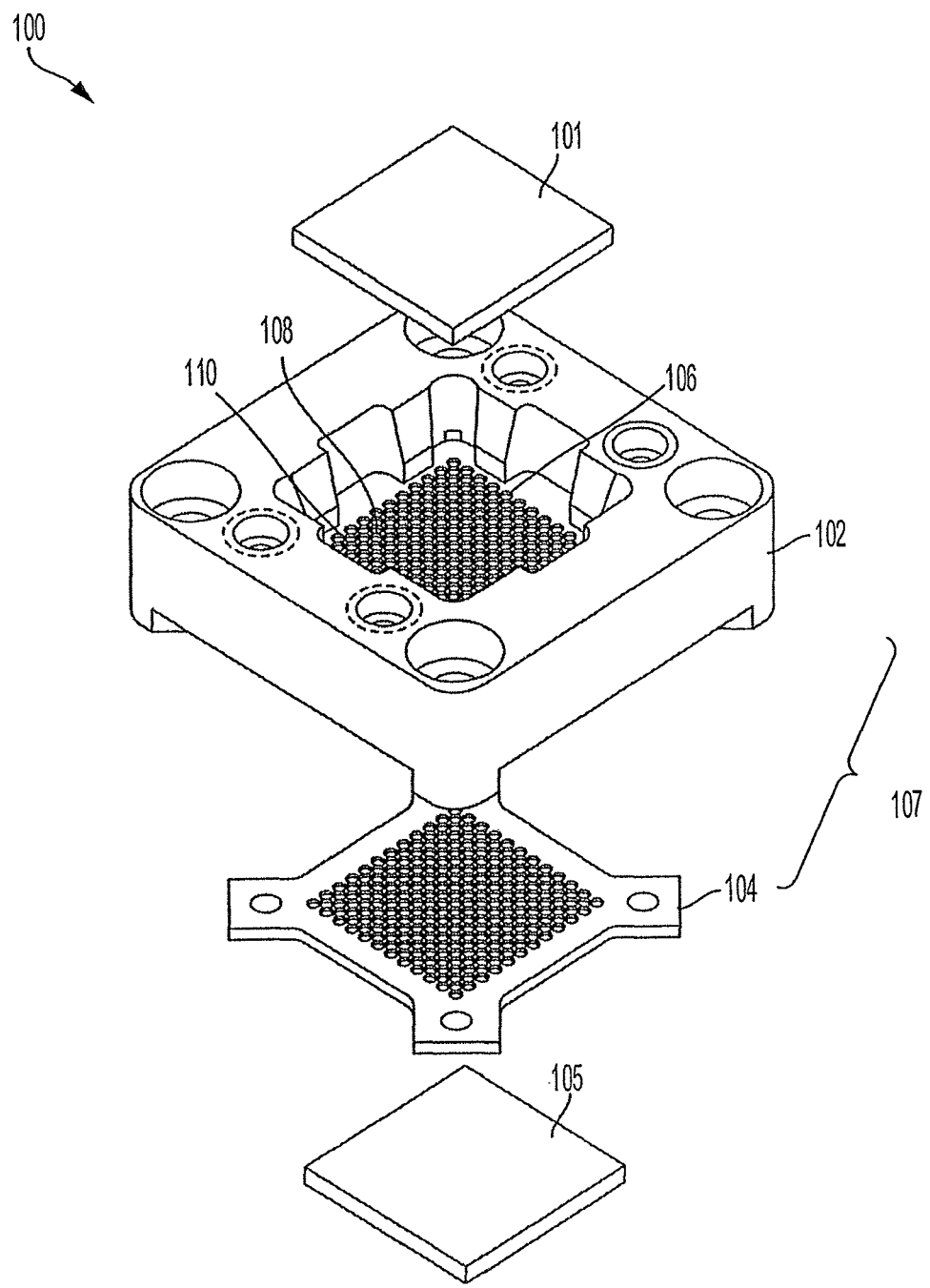
FIG. 1 shows an example electrical connector assembly for connecting an integrated circuit chip (IC) to a printed circuit board (PCB) according to an aspect of the invention.

FIG. 1 shows an electrical connector assembly 100. The electrical connector assembly 100 (or "test system") tests an integrated circuit (IC) chip 101. The test system 100 tests the IC chip 101 at higher frequencies, such as at high frequencies of approximately greater than 56 Gbps or greater than 70 GHz, with a smaller signal loss. The test system 100 has a socket body 102 and/or a socket retainer 104. The socket body 102 and the socket retainer 104 may be referred to as a socket 107. The socket body 102 and/or the socket retainer 104 may be of the same height or of different heights. The socket body 102 and the socket retainer 104 may be made from a plastic material, Peek Rigid or other dielectric material. The plastic may be a high strength dielectric composite plastic material or other insulating material that protects and prevents electrical shorts between the integrated circuit (IC) 101, the printed circuit board 105 and the components of the test system 100.

Figure 2A:
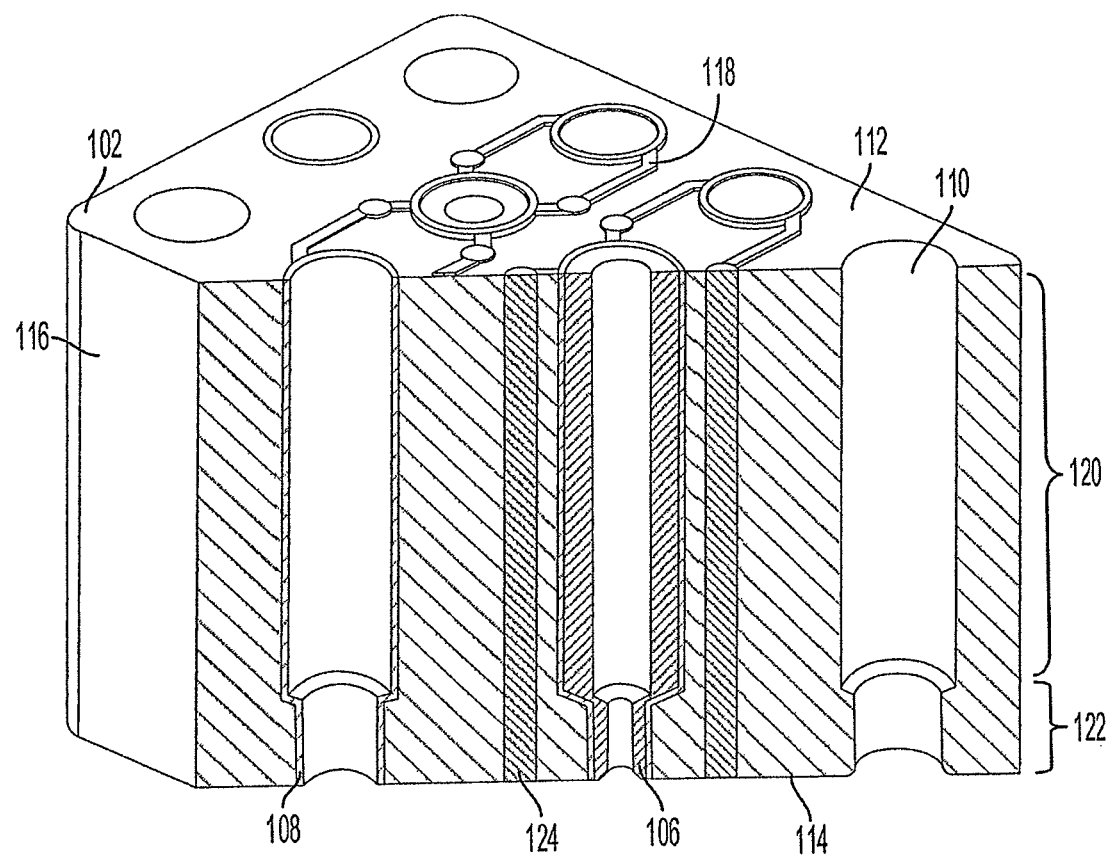
FIG. 2A is a cross sectional view of the electrical connector assembly of FIG. 1 according to an aspect of the invention.

The socket body 102 and/or the socket retainer 104 may form a cartridge that holds the one or more cavities 106, 108, 110, as shown in FIG. 2A. The cartridge may have a top portion 120 and a bottom portion 122. The top portion 120 may include the socket body 102 and may have a top surface 112 and a bottom surface 114. The bottom portion 122 may include the socket retainer 104 and may have a top surface 216 and a bottom surface 218. During assembly, the bottom portion 122 may be positioned adjacent to the top portion 120 such that the top surface 216 of the bottom portion 122 is in contact with the bottom surface 114 of the top portion 120 and the one or more cavities 106, 108, 110 are aligned. The cartridge may have multiple side surfaces 116 on each of the portions 120, 122 including the socket body 102 and/or the socket retainer 104. The bottom portion 122 and/or the top portion 120 may be made of the insulating material.

On the top surface 112 and the bottom surface 114, are one or more holes or openings for one or more cavities 106, 108, 110. The one or more openings may be of and lead to the cavities of the one or more cavities 106, 108, 110. The one or more cavities 106, 108, 110 may be cylindrically shaped and extend a height of the entire socket body 102 from the top surface 112 to the bottom surface 114. In some implementations, the one or more cavities 106 may be trapezoidal, triangular, rectangular or other polygonal shape. The corresponding probe may similarly be shaped as a cylinder, trapezoid, triangle, rectangular or other polygonal shape.

Figure 2B:
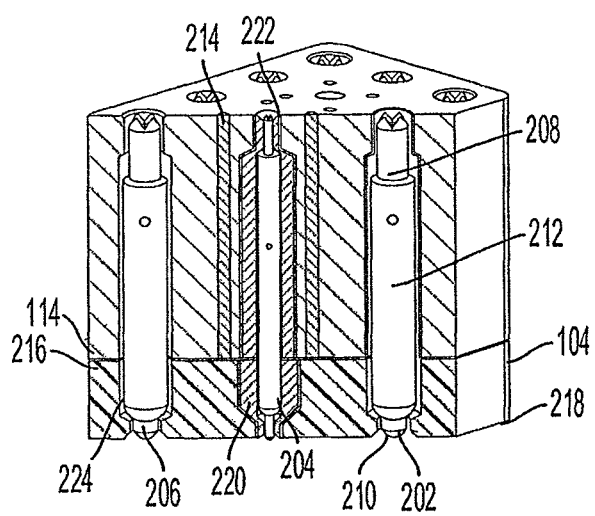
FIG. 2B shows the positioning of one or more probes within the one or more cavities of the electrical connector assembly of FIG. 1 according to an aspect of the invention.

In some implementations, the one or more cavities 106, 108, 110 may extend through the entire socket retainer 104, which may be positioned adjacent to and below the socket body 102, as shown in FIG. 2B. The top surface 216 of the socket retainer 104 may be positioned adjacent to the bottom surface 114 of the socket body 102. The one or more cavities 106, 108, 110 may extend through the socket retainer 104 such that a top portion of the cavities 106, 108, 110 is within the socket body 102 and a bottom portion of the cavities 106, 108, 110 is within the socket retainer 104. The two portions of the cavities 106, 108, 110 within the socket body 102 and the socket retainer 104 may form the entirety of the cavities 106, 108, 110.

In some implementations, the socket body 102 and the socket retainer 104 each have separate cavities 106, 108, 110 and when the socket retainer 104 and the socket body 102 are placed adjacent to one another and aligned, the separate cavities 106, 108, 110 are aligned and formed. The socket retainer 104 and the socket body 102 are adjacent to one another when a bottom surface 114 of the socket body 102 is in contact with the top surface 216 of the socket retainer 104 to form the cavities 106, 108, 110. When all the edges of the socket retainer 104 and the socket body 102 match, the socket retainer 104 and the socket body 102 are aligned, and so the multiple cavities 106, 108, 110 on the socket retainer side and the socket body side are aligned. The one or more probes 202, 204, 206 when inserted within the one or more cavities 106, 108, 110 may extend outward through the top surface 112 of the socket body 102 and through a bottom surface 218 of the socket retainer 104.

The one or more cavities 106, 108, 110 may include at least three cavities—at least one for a ground contact probe, at least one for a signal contact probe, and at least one for a power contact probe. The one or more cavities 106, 108, 110 may include one or more signal spring pin cavity holes 106, one or more ground spring probe cavities 108 and one or more power contact cavities 110.

The one or more signal spring pin cavity holes 106 may receive, enclose or otherwise hold or include a signal contact probe 204 and the one or more ground spring probe cavities 108 may receive, enclose or otherwise hold a ground contact probe 202. The one or more signal spring pin cavity holes 106 along with the signal contact probe 204 that contacts conductive pads of the IC 101 and the printed circuit board 105 passes signals between the IC 101 and the printed circuit board 105 through the test system 100 when the signal contact probe 204 is within. The one or more ground spring probe cavities 108 along with the ground contact probe 202 grounds the electrical connections.

The signal spring pin cavity holes 106 and the one or more ground spring probe cavities 108 may have an inner surface, which are plated with a conductive material, and when electrically connected, may form a coaxial structure. The one or more power contact cavities 110 may receive, enclose or otherwise hold a power contact probe 206. When the power contact probe 206 is inserted into the one or more power contact cavities 110, power is provided throughout the test system 100.

Each cavity 106, 108, 110 has an inner or interior surface. The inner surface of the cavity may have a metal grounding shell 222, 224 which may be made or uniformly plated using a conductive material, such as copper. For example, an interior surface of the ground spring probe cavity 108 and the signal spring pin cavity hole 106 may be plated with the conductive material. In another example, the metal grounding shells 222, 224 may be built in the signal spring pin cavity holes 106 and the ground spring probe cavities 108. The metal grounding shells 222, 224 may form a coaxial structure which provides impedance control.

Figure 3A:
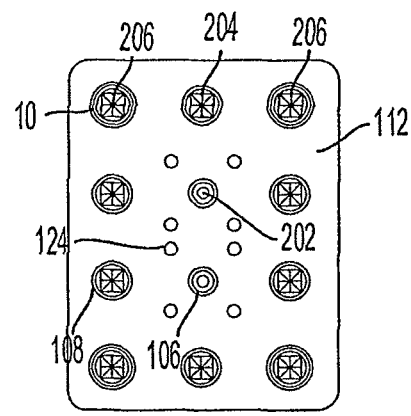
FIG. 3A shows a top perspective view of the electrical connector assembly of FIG. 1 according to an aspect of the invention.
Figure 3B:
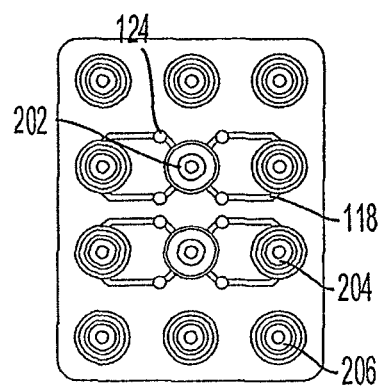
FIG. 3B shows a bottom perspective view of the electrical connector assembly of FIG. 1 according to an aspect of the invention.
Figure 3C:
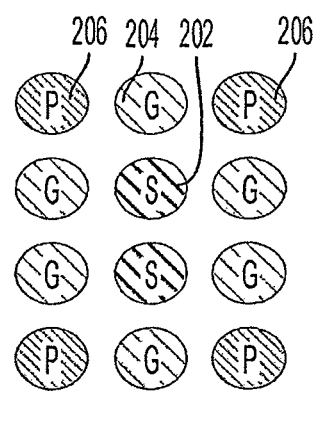
FIG. 3C shows an arrangement of the different cavities of the electrical connector assembly of FIG. 1 according to an aspect of the invention.

The one or more cavities 106, 108, 110 may be arranged in a matrix or array, as shown in FIGS. 3A-3C. FIG. 3A shows the arrangement of the different cavities 106, 108, 110 on a top surface 112 of the socket body 102. The top surface 112 may have an insulative layer on top the test system 100 from contact with a foreign object, which may cause an electrical short. FIG. 3B shows the arrangement of the different cavities 106, 108, 110 from the perspective of the bottom surface 114 of the socket body 102 or the bottom surface 218 of the socket retainer 104 along with the one or more micro trace lines 118. The arrangement of the different cavities 106, 108, 110 on the top surface 112 and on the bottom surface 114 is further described below.

The test system 100 has one or more micro trace lines 118. The one or more micro trace lines 118 cover the surface of the socket body 102. The one or more micro trace lines 118 may be formed on the top surface 112, for example. The one or more micro trace lines connect the grounded metal shield shells in the various cavities 106, 108. The one or more micro trace lines 118 connect the grounded metal shield shells in the various cavities 106, 108 so that when the different probes are inserted into the various cavities 106, 108 a coaxial structure is formed.

The test system 100 may have one or more other holes, such as one or more ground needle cavities 124. The one or more ground needle cavities 124 may extend a height or length of the socket body 102 and/or the socket retainer 104. For example, the one more ground needle cavities 124 may extend through the top portion 120 and/or the bottom portion 122 via a hole in the bottom surface 114 and the top surface 216. The one or more ground needle cavities 124 may extend partially or entirely through the top portion 120 and/or entirely through or partially through to the bottom portion 122.

The one or more ground needle cavities 124 may be positioned around the one or more other cavities 106, 108, 110. When the one or more probes 204, 206, 208 are positioned, inserted or surrounded or otherwise embedded within the one or more cavities 106, 108, 110 and the ground needles 214 are inserted, received or otherwise embedded within the one or more ground needle cavities 124, the ground needles 214 are positioned around the one or more signal contact probes 204. The ground needles 214 are around the signal contact probes 204 to filter noise and improve the radio frequency (RF) performance.

FIG. 2 shows the test system 100 with one or more probes 202, 204, 206 and one or more ground needles 214. The one or more probes 202, 204, 206 include at least one ground contact probe 202, at least one signal contact probe 204, and at least one power contact probe 206. Each of the one or more probes 202, 204, 206 may have a plunger on each end and a shell 212 in between. The one or more probes 202, 204, 206 may be formed from conductive materials, such as copper allow coated with gold, so that an electrical connection is formed between the two plungers 208, 210 and the shell 212. In some implementations, the one or more probes 202, 204, 206 may be a spring probe with a spring within the shell 212.

The one or more probes 202, 204, 206 may be positioned such that a plunger 208 on one end of the probe electrically connects to conductive pads on the IC chip 101 through a hole on a surface of the socket body 102 or the socket retainer 104. The hole may be on or within the top surface 112 of the socket body 102 or the bottom surface 218 of the socket retainer 104. The other plunger 210 on an opposite end of the probe electrically connects to conductive pads on the printed circuit board 105 through another hole in of the bottom surface 218 of the socket retainer 104 or the top surface 112 of the socket body 102. In some implementations, the plunger 208 is on the other end of the probe and electrically connects to conductive pads on the printed circuit board and the other plunger 210 is on the opposite end of the probe and electrically connects to conductive pads on the IC chip.

Each plunger 208, 210 of the probes 202, 204, 206 may have a top portion that extends away from or outwardly from a shell 212 of the probe and a flange portion located within the shell 212. The shell 212 may be positioned in between the plunger 208 and the plunger 210 and in between the ends of the probe. The shell 212 may be cylindrically shaped with a spring within and disposed between the two plungers 208, 210. The spring may be capable of exerting a force against each plunger 208, 210 to bias the plunger 208, 210 outwardly from the shell 212 and away from the other plunger 208, 210.

Figure 4:
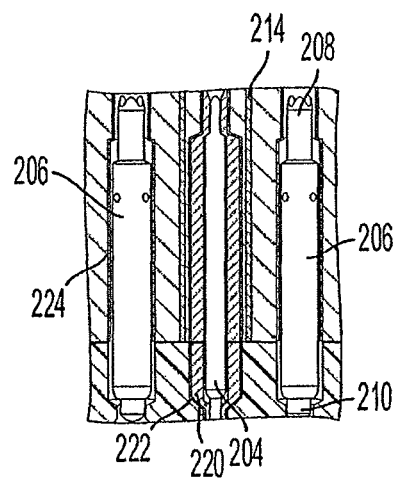
FIG. 4 shows another cross-sectional view of the electrical connector assembly of FIG. 1 according to an aspect of the invention.

The signal contact probe 204 may be received, encapsulated, embedded or otherwise surrounded, included or placed within one of the spring pin cavity holes 106. The signal contact probe 204 and the corresponding signal spring pin cavity hole 106, which has the metal grounding shell 222, forms a coaxial structure to provide controlled impedance (e.g., 50 Ohm impedance) to have improved signal integrity performance. The signal contact probe 204 may be surrounded by a layer of insulation 220 that is in between the signal contact probe 204 and the metal grounding shell 222 of one of the spring pin cavity holes 106, as shown in FIG. 4 for example. The layer of insulation 220 prevents electrical shorts between the signal contact probe 204 and the metal grounding shell 222 of the signal spring pin cavity hole 106.

The ground contact probe 202 may be received, encapsulated, embedded or otherwise surrounded, included or placed within one of the ground spring probe cavities 108. The ground contact probe 202 and the corresponding ground spring probe cavity 108, which has the metal grounding shell 222, provides an electrical ground. The ground contact probe 202 when within the ground spring probe cavity 108 grounds the electrical connections of the test system 100.

The metal grounding shells 222 of the signal spring pin cavity holes 106 must be connected to the metal grounding shells 224 of the ground spring probe cavities 108 to ensure that the signal spring pin cavity holes 106 are grounded. Further, a dielectric material or air is located between the signal contact probe 204 and the metal grounding shell 222 of the signal spring pin cavity holes 106 to avoid shortage of the signal contact probe to the metal grounding shell 222. Epoxy may be used between the metal grounding shells 222, 224 and their respective interior cavity walls of the socket body 102 to bind them together.

The test system 100 may have one or more ground needles 214. The one or more ground needles 214 ("or ground needle filters") are positioned around the one or more signal contact probes 204, as shown in FIG. 3A, within the one or more ground needle cavities 124. The one or more ground needles 214 may be surrounded, embedded, inserted or otherwise positioned within the one or more ground needle cavities 124.

FIGS. 3A-3C show an example arrangement of the different components of the test system 100. The different components include the cavities 106, 108, 110 along with the one or more micro trace lines 118 that electrically connect the different cavities 106, 108, 110 to form the coaxial structure. The different probes and ground needles of the test system 100 may be arranged in various different arrangements to accommodate different electrical devices, such as different ICs and printed circuit boards. In this example, the test system 100 has power contact probes 206 positioned in the one or more power contact cavities 110 in four corners of the socket body 102, as shown in FIG. 3C. The ground contact probes 202 may be positioned in ground spring probe cavities 108 along the edges of the top surface 112 in between the power contact probes 206. The ground contact probes 202 and the power contact probes 206 may be positioned surrounding the signal contact probes 204 that are positioned within the signal spring pin cavity holes 106, which may be centered within the top surface 112.

Figure 5:
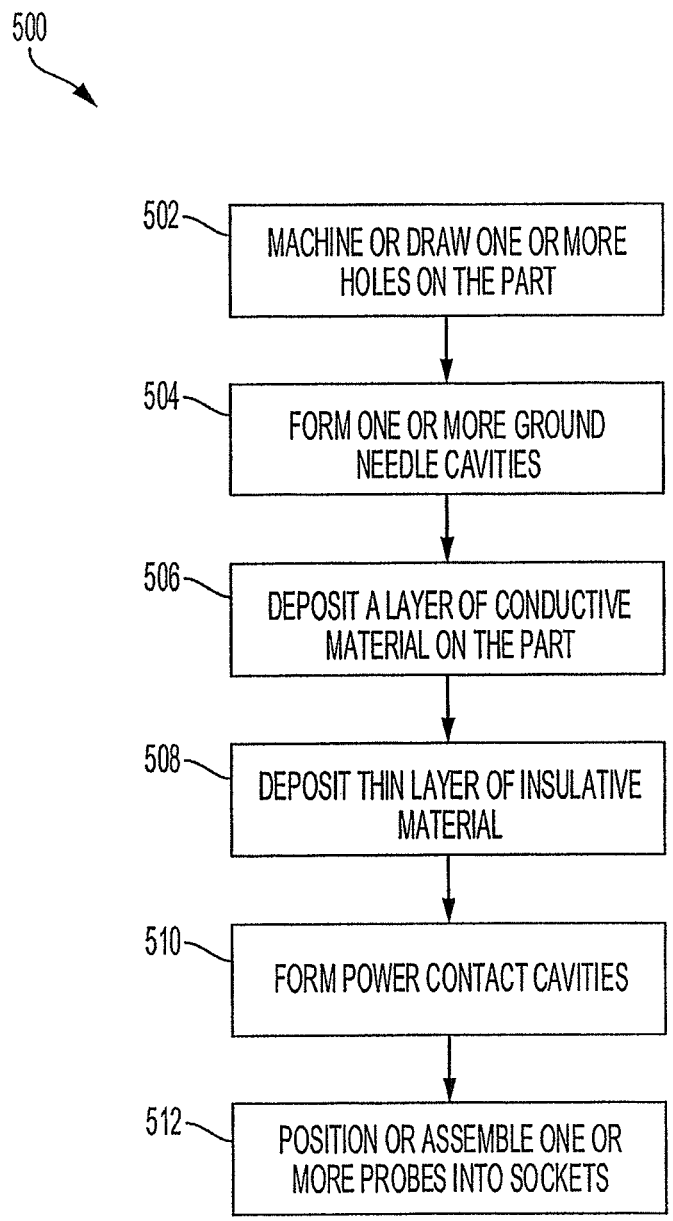
FIG. 5 is an example flow diagram of the fabrication process of the electrical connector assembly of FIG. 1 according to an aspect of the invention.

FIG. 5 is a flow diagram of an example process for fabricating the test system 100. The test system 100 may be manufactured or fabricated using a fabrication tool, device or other machine ("fabrication tool"). The fabrication tool may deposit conductive material or insulation material onto the socket body 102 and/or the socket retainer 104 or may etch or otherwise remove conductive or insulation material on the socket body 102 and/or the socket retainer 104 to form one or more cavities 106, 108, 110 and/or one or more probes 202, 204, 206.

A plastic body, such as the socket body 102 and/or the socket retainer 104 or other "part," made of insulative material may be provided and placed in a position where the fabrication tool may form the test system 100. The fabrication tool may mechanically machine or draw one or more holes on the part (502). The fabrication tool may deposit, etch out, drill or otherwise add or remove the insulation material from the part to form the one or more holes within the part. The cavities formed may extend the entire height of the socket body 102 and/or the socket retainer 104 or a partial height of the socket body 102 and/or the socket retainer 104, for example. The cavities may be used for the one or more cavities 106, 108 such as the signal spring pin cavity holes 106 and the ground spring probe cavities 108 where the one or more probes 202, 204 may be inserted, embedded or otherwise later positioned. The fabrication tool may first machine or draw the one or more holes on the socket body 102, and may then similarly machine or draw one or more holes on the socket retainer 104 that align with the one or more holes on the socket body 102. In some implementations, the fabrication tool may also etch out, draw out, drill or otherwise remove the insulation material of the part to form one or more other holes for the one or more ground needle cavities 124 (504).

The fabrication tool chemically deposits, plates or otherwise coats a layer of metal, such as copper, or other conductive material on the surface of the part (506). The fabrication tool may be used to coat, plate or cover the entire surface of the part including the top surface, bottom surface, all side surfaces, and the interior surfaces of the one or more holes. The fabrication tool deposits the layer of conductive material within one or more of the holes, such as an interior or inner surface of the signal spring pin cavity holes 106 and the ground spring probe cavities 108. When the fabrication tool deposits the layer of conductive material within the interior or inner surface of the signal spring pin cavity holes 106 and the ground spring probe cavities 108, the fabrication tool forms the metal grounding shells 222, 224 of the signal spring pin cavity holes 106 and the ground spring probe cavities 108, respectively. This plates the part with a layer of conductive material.

The fabrication tool may deposit a thin layer of insulative material on top of the layer of conductive material on the top surface 112 of the socket body 102 (508). The layer of insulative material insulates the test system 100 from the other electrical devices, such as the integrated circuit and/or the printed circuit board. The layer of insulative material protects the test system 100 from being shorted by any contact with the test system 100.

The fabrication tool machines or draws out the one or more holes for the power contact cavities 110 (510). The fabrication tool drills, etches or otherwise removes the insulation material and the plated layer of conductive material to form the one or more holes for the power contact cavities 110 where the power contact probes 206 are inserted or otherwise positioned.

The fabrication tool machines, etches or otherwise draws out areas of the layer of conductive material to create an area of insulation among the power contact cavities 110, the signal spring pin cavity holes 106 and the ground spring probe cavities 108 (510). This creates an insulative barrier between the power contact cavities 110 and the other cavities 106, 108, which form the coaxial structure, to prevent electrical shorts. The fabrication tool may machine or draw out the one or more holes in the arrangement, as shown in FIGS. 3A-3C for example.

The fabrication tool may insert, embed or otherwise position or assemble the one or more probes 202, 204, 206 into the corresponding cavities 106, 108, 110 (512). When the part is formed using multiple portions, such as a top portion or socket body 102 and a bottom portion or socket retainer 104, the two portions may be similarly formed, as described above, and subsequently aligned, such that the cavities 106, 108, 110 align and are placed together around the one or more probes 202, 204, 206. The process 500 may be used to form the socket body 102 and/or the socket retainer 104, and then, the two portions are aligned, moved and positioned together to form the test system 100.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An electrical connector assembly for connecting an integrated circuit chip to a printed circuit board, the electrical connector assembly comprising:
   a socket body being made of an insulating material, the socket body having a top surface, a bottom surface, and a first plurality of cavities including a first cavity and a second cavity that extends from the top surface through to the bottom surface, the first cavity and the second cavity each having an inner surface plated with a conductive material to form a metal grounding shell, the first cavity being a signal pin cavity hole and the second cavity being a ground spring probe cavity, the first plurality of cavities including one or more ground needle cavities that extend through a length of the socket body;
   a plurality of probes including a first probe and a second probe, the first probe being configured to be positioned within the first cavity and the second probe being configured to be positioned within the second cavity, the first probe being a signal contact probe and the second probe being a ground contact probe, the ground contact probe contacts the ground spring probe cavity, the signal contact probe being separated from the metal grounding shell of the first cavity by an insulative layer;
   one or more signal traces that electrically connect the metal grounding shells of the first cavity and the second cavity to form a coaxial structure; and
   one or more ground needles configured to filter noise, improve radio frequency performance and minimize interference of signals within the signal contact probe, the one or more ground needles being positioned in the one or more ground needle cavities and adjacent or around the signal pin cavity hole.

2. The electrical connector assembly of claim 1, further comprising:
   a socket retainer being made of the insulating material and having a top surface, a bottom surface and a second plurality of cavities including a first cavity and a second cavity, the second plurality of cavities being aligned with the first plurality of cavities.

3. The electrical connector assembly of claim 2, wherein when the first cavity and the second cavity of the first plurality of cavities are aligned with the first cavity and the second cavity of the second plurality of cavities.

4. The electrical connector assembly of claim 1, wherein the first plurality of cavities includes a third cavity, wherein the third cavity is a power contact cavity that is configured to encapsulate a power contact probe that provides power when inserted.

5. The electrical connector assembly of claim 1, wherein the one or more signal traces electrically connect the metal grounding shell of the ground spring probe cavity and the metal grounding shell of the signal pin cavity hole to form a coaxial structure to provide controlled impedance to improve signal integrity.

6. The electrical connector assembly of claim 1, wherein the first probe has a first plunger, a second plunger, a first end, a second end and a cylindrical shell in between the first end and the second end, wherein the first plunger is on the first end and the second plunger is on the second end.

7. The electrical connector assembly of claim 6, wherein the first probe is a spring probe and has a spring within the cylindrical shell.

8. An electrical connector assembly for connecting an integrated circuit chip to a printed circuit board, the electrical connector assembly comprising:
   an insulated body having a top surface, a bottom surface, a signal spring pin cavity hole, a power contact cavity, and a ground spring probe cavity, the signal spring pin cavity hole and the ground spring probe cavity each having an interior surface plated with a conductive material to form a metal grounding shell, the power contact cavity has four power contact cavities each positioned in a corner of the insulated body and the ground spring probe cavity includes a plurality of ground spring probe cavities positioned along edges of the insulated body, the plurality of ground spring probe cavities and the four power contact cavities surround the signal spring pin cavity hole;
   a plurality of probes including a signal contact probe, a ground contact probe, and a power contact probe; and
   one or more signal traces that electrically connect the metal grounding shell of the signal spring pin cavity hole and the ground spring probe cavity to form a coaxial structure,
   wherein the power contact cavity is configured to encapsulate the power contact probe to provide power when the power contact probe is inserted.

9. The electrical connector assembly of claim 8, wherein the insulated body has one or more ground needle cavities that extend through a length of the insulated body.

10. The electrical connector assembly of claim 9, further comprising:
    one or more ground needles are configured to filter noise, improve radio frequency performance and minimize interference of signals within the first probe, wherein the one or more ground needles are positioned in the one or more ground needle cavities and adjacent or around the signal pin cavity hole.

11. The electrical connector assembly of claim 8, wherein the signal contact probe has a first plunger, a second plunger, a first end, a second end, a spring and a cylindrical shell in between the first end and the second end, wherein the first plunger is on the first end and the second plunger is on the second end and the spring is within the cylindrical shell.

12. The electrical connector assembly of claim 11, wherein the first plunger is configured to electrically contact with a conductive pad of an integrated circuit through the top surface and the second plunger is configured to electrically contact with a conductive pad of a printed circuit board through the bottom surface.

13. An electrical connector assembly for connecting an integrated circuit chip to a printed circuit board, the electrical connector assembly comprising:
  an insulated body having a top surface, a bottom surface, a signal spring pin cavity hole, a ground spring probe cavity and one or more ground needle cavities that extend through a length of the insulated body, the signal spring pin cavity hole and the ground spring probe cavity each having an interior surface plated with a conductive material to form a metal grounding shell;
  a plurality of probes including a signal contact probe and a ground contact probe;
  one or more signal traces that electrically connect the metal grounding shell of the signal spring pin cavity hole and the ground spring probe cavity to form a coaxial structure; and
  one or more ground needles configured to filter noise, improve radio frequency performance and minimize interference of signals within the signal contact probe, wherein the one or more ground needles are positioned in the one or more ground needle cavities and adjacent or around the signal pin cavity hole.

14. The electrical connector assembly of claim 13, wherein the insulated body has a power contact cavity and the plurality of probes includes a power contact probe, wherein the power contact cavity is configured to encapsulate the power contact probe to provide power when the power contact probe is inserted.

15. The electrical connector assembly of claim 14, wherein the power contact cavity has four power contact cavities each positioned in a corner of the insulated body and the ground spring probe cavity includes a plurality of ground spring probe cavities positioned along edges of the insulated body, wherein the plurality of ground spring probe cavities and the four power contact cavities surround the signal spring pin cavity hole.

16. The electrical connector assembly of claim 13, wherein the signal contact probe has a first plunger, a second plunger, a first end, a second end, a spring and a cylindrical shell in between the first end and the second end, wherein the first plunger is on the first end and the second plunger is on the second end and the spring is within the cylindrical shell.

17. The electrical connector assembly of claim 16, wherein the first plunger is configured to electrically contact with a conductive pad of an integrated circuit through the top surface and the second plunger is configured to electrical contact with a conductive pad of a printed circuit board through the bottom surface.

* * * * *